(12) United States Patent
Koshihara

(10) Patent No.: US 9,093,408 B2
(45) Date of Patent: Jul. 28, 2015

(54) ORGANIC EL DEVICE AND ELECTRONIC APPARATUS

(71) Applicant: SEIKO EPSON CORPORATION, Tokyo (JP)

(72) Inventor: Takeshi Koshihara, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/262,075

(22) Filed: Apr. 25, 2014

(65) Prior Publication Data

US 2014/0231778 A1   Aug. 21, 2014

Related U.S. Application Data

(62) Division of application No. 13/446,508, filed on Apr. 13, 2012, now Pat. No. 8,890,124.

(30) Foreign Application Priority Data

Apr. 18, 2011   (JP) .................................. 2011-091799

(51) Int. Cl.
*H01L 29/49*     (2006.01)
*H01L 27/32*     (2006.01)
*H01L 51/52*     (2006.01)

(52) U.S. Cl.
CPC ........ *H01L 27/3265* (2013.01); *H01L 51/5265* (2013.01); *H01L 2227/32* (2013.01)

(58) Field of Classification Search
CPC ............ H01L 27/3265; H01L 51/5265; H01L 2227/32
See application file for complete search history.

(56) References Cited

U.S. PATENT DOCUMENTS

| 8,497,496 B2 | 7/2013 | Ozawa |
| 2004/0012548 A1 | 1/2004 | Anzai |
| 2007/0268210 A1 | 11/2007 | Uchino et al. |

FOREIGN PATENT DOCUMENTS

| JP | A-2000-513443 | 10/2000 |
| JP | A-2003-232133 | 8/2003 |
| JP | A-2003-323133 | 11/2003 |
| JP | A-2007-220395 | 8/2007 |
| JP | A-2007-310311 | 11/2007 |

*Primary Examiner* — Michael Shingleton
(74) *Attorney, Agent, or Firm* — Oliff PLC

(57) ABSTRACT

An organic EL device includes a reflecting layer which has at least light reflectivity, a first electrode which is arranged on the reflecting layer through a first insulating layer, an organic functional layer which is arranged on the first electrode and includes at least a light emitting layer, a second electrode which is arranged on the organic functional layer and has at least light reflectivity, and a holding capacitance. In the organic EL device, an optical resonator which resonates light from the organic functional layer is formed by the reflecting layer and the second electrode, and the holding capacitance is formed using the reflecting layer, the first insulating layer, and the first electrode.

16 Claims, 6 Drawing Sheets

ORGANIC EL DEVICE AND ELECTRONIC APPARATUS

This application is a divisional application of U.S. application Ser. No. 13/446,508, filed Apr. 13, 2012, the entire contents of which are herein incorporated by reference.

BACKGROUND

1. Technical Field

The present invention relates to an organic EL device, and an electronic apparatus including the organic EL device.

2. Related Art

In recent years, an organic EL device using an electro luminescence (hereinafter, referred to as "EL") element has attracted considerable. For example, research and development on an organic EL device including a transistor as a switching element which drives the EL element has been accelerated. There has been known an existing organic EL device as described in JP-A-2007-310311, for example.

The organic EL device as described in JP-A-2007-310311 includes a pixel circuit. The pixel circuit includes a transistor which controls driving of an organic EL element constituting a pixel and a capacitive element.

Further, as a method of realizing a capacitive element constituting a pixel circuit, a method of realizing the capacitive element using a layer configuration constituting a transistor as described in JP-A-2003-323133 has been known. FIG. 7 is a cross-sectional view illustrating configurations of a driving transistor and a capacitive element in an existing technique.

Further, the organic EL device has a configuration in which a positive electrode, an organic functional layer including at least a light emitting layer, and a negative electrode are laminated. For example, the organic EL device of a top emission type has a positive electrode having a light reflectivity or a reflecting layer so that light generated on the light emitting layer is emitted to the negative electrode side.

Further, in JP-A-2007-220395, in order to make brightness of light emitted from an organic EL device higher, a method of amplifying and extracting light having a resonant wavelength by providing an optical resonator which resonates light from an organic functional layer between a reflecting layer provided at a lower layer side of a positive electrode and a negative electrode has been disclosed.

However, in the organic EL device as described in JP-A-2003-323133, as illustrated in FIG. 7, a pixel selection transistor, a driving transistor 8F and a capacitive element 8G are required to be formed so as to be lined on the same plane. As a result, there arises a problem that a capacity to be required cannot be ensured and display quality is deteriorated. In addition, there is a problem that a size of the pixel circuit is limited and therefore, an entire device is difficult to be reduced in size.

SUMMARY

An advantage of some aspects of the invention is to solve at least one of the issues mentioned above and can be realized in the following modes or Application Examples.

Application Example 1

An organic EL device according to the Application Example includes a base substrate, a reflecting layer which is arranged on the base substrate and has light reflectivity, a first electrode which is arranged on the reflecting layer through an insulating layer for each pixel and has light transmissivity, an organic functional layer which is arranged on the first electrode and includes at least a light emitting layer, a second electrode which is arranged on the organic functional layer and has light reflectivity and light transmissivity, an optical resonator which is formed between the reflecting layer and the second electrode and resonates light from the organic functional layer, and a pixel circuit which drives the pixel having a laminate structure from the first electrode to the second electrode and includes at least a holding capacitance. In the organic EL device, the holding capacitance is constituted using the reflecting layer, the insulating layer, and the first electrode.

According to the Application Example, the organic EL device includes the optical resonator which is arranged on the organic functional layer, is formed between the reflecting layer and the second electrode, and resonates light from the organic functional layer. In addition, the holding capacitance is constituted by the reflecting layer, the insulating layer, and the first electrode. Therefore, a large aperture ratio of the pixel can be obtained while ensuring the holding capacitance. This makes it possible to form each pixel smaller in size.

Accordingly, the organic EL device of a top emission type which is reduced in size and has high quality can be provided.

Application Example 2

An organic EL device according to the Application Example includes a base substrate, a reflecting semi-transmissive layer which is arranged on the base substrate and has light reflectivity and light transmissivity, a first electrode which is arranged on the reflecting semi-transmissive layer through an insulating layer for each pixel and has light transmissivity, an organic functional layer which is arranged on the first electrode and includes at least a light emitting layer, a second electrode which is arranged on the organic functional layer and has light reflectivity, an optical resonator which is formed between the reflecting semi-transmissive layer and the second electrode and resonates light from the organic functional layer, and a pixel circuit which drives the pixel having a laminate structure from the first electrode to the second electrode and includes at least a holding capacitance. In the organic EL device, the holding capacitance is constituted using the reflecting semi-transmissive layer, the insulating layer, and the first electrode.

According to the Application Example, the organic EL device includes the optical resonator which is arranged on the organic functional layer, is formed between the reflecting semi-transmissive layer and the second electrode, and resonates light from the organic functional layer. In addition, the holding capacitance is constituted using the reflecting semi-transmissive layer, the insulating layer, and the first electrode. Therefore, a large aperture ratio of the pixel can be obtained while ensuring the holding capacitance. This makes it possible to form each pixel smaller in size.

Accordingly, the organic EL device of a bottom emission type which is reduced in size and has high quality can be provided.

Application Example 3

In the organic EL device according to the above Application Example, it is preferable that emitted lights having different colors be obtained on adjacent pixels.

According to the Application Example, emitted lights having different colors can be obtained on adjacent pixels. Therefore, natural display with red, green, and blue, for example, can be realized.

Accordingly, an effect that the organic EL device can realize natural display can be obtained.

Application Example 4

It is preferable that an electronic apparatus according to the Application Example include the organic EL device according to the above Application Example.

With this, an electronic apparatus which can display with high definition and is reduced in size can be realized.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention are described with reference to drawings. In the following drawings, scales of layers and members are made different from actual scales thereof for making the layers and the members have sizes that can be recognized.

First Embodiment

Organic EL Device

At first, a schematic configuration of an organic EL device according to the embodiment is described with reference to FIG. 1 to FIG. 4.

Figure 1:
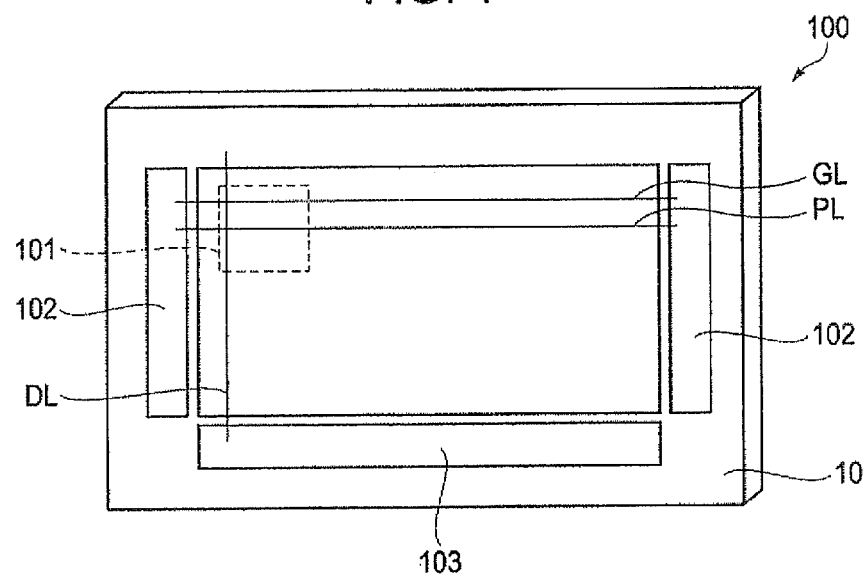
FIG. 1 is a view schematically illustrating a configuration of an organic EL device according to a first embodiment.
Figure 2:
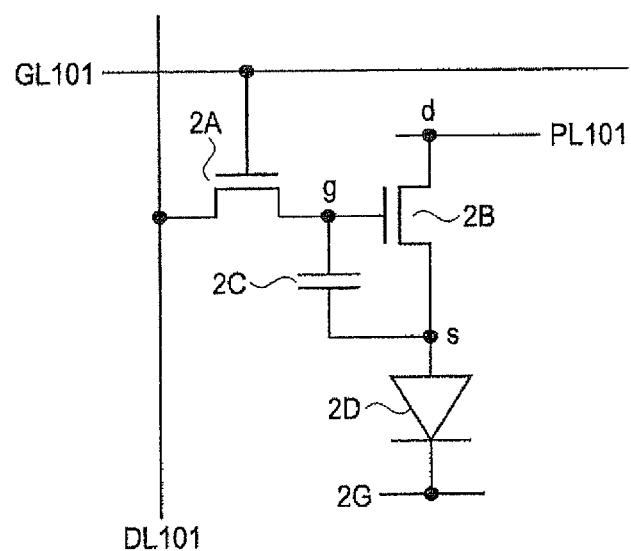
FIG. 2 is an equivalent circuit diagram illustrating an electric configuration of the organic EL device according to the first embodiment.
Figure 3:
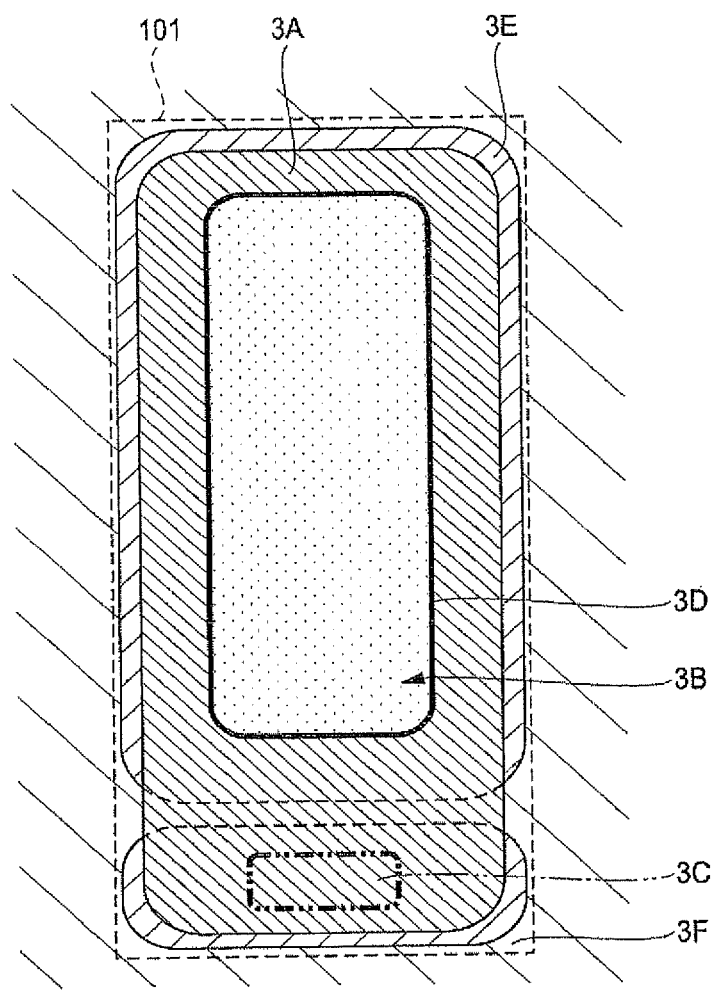
FIG. 3 is a schematic plan view illustrating a configuration of a pixel on the organic EL device according to the first embodiment.
Figure 4:
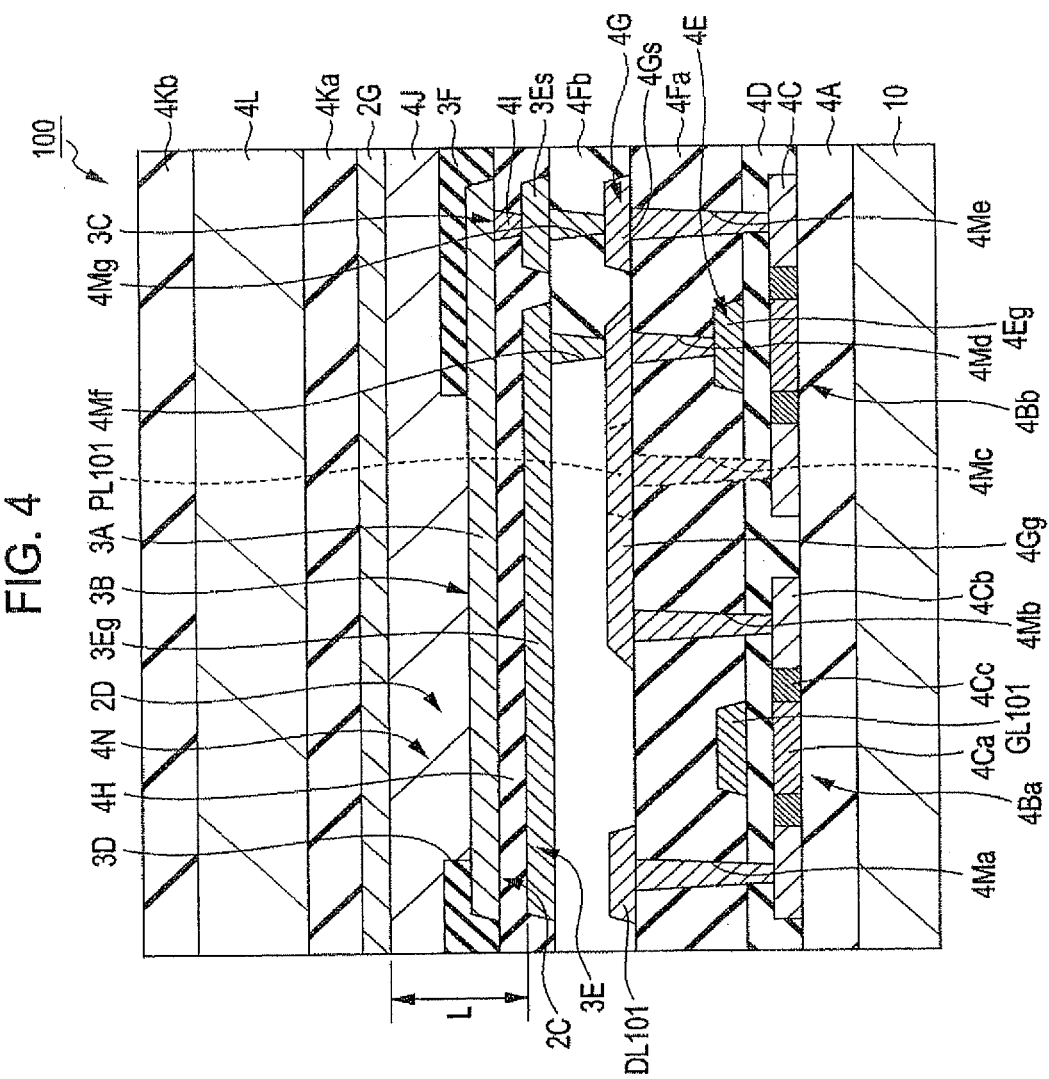
FIG. 4 is a schematic cross-sectional view illustrating a configuration of the pixel on the organic EL device according to the first embodiment.

FIG. 1 is a view schematically illustrating a configuration of an organic EL device according to the embodiment. FIG. 2 is an equivalent circuit diagram illustrating an electric configuration of the organic EL device according to the embodiment. FIG. 3 is a schematic plan view illustrating a configuration of a pixel on the organic EL device according to the embodiment. FIG. 4 is a schematic cross-sectional view illustrating a configuration of the pixel on the organic EL device according to the embodiment.

As illustrated in FIG. 1, an organic EL device 100 according to the embodiment is an active matrix-type organic EL device using a thin film transistor (hereinafter, referred to as TFT) as a switching element.

The organic EL device 100 includes a substrate 10 as a base substrate, scan lines GL provided on the substrate 10, power lines PL arranged in parallel with the scan lines GL, and signal lines DL extending in a direction intersecting with the scan lines GL. In the organic EL device 100, pixels 101 are arranged on a region surrounded by the scan lines GL and the signal lines DL. The pixels 101 are arranged in matrix form along the extending direction of the scan lines GL and the extending direction of the signal lines DL.

Scan line driving circuits 102 and a signal line driving circuit 103 are provided on peripheries of a region on which the plurality of pixels 101 are provided. The plurality of scan lines GL are connected to the scan line driving circuits 102. The plurality of signal lines DL are connected to the signal line driving circuit 103.

Although not illustrated in FIG. 1, a test circuit, a test pattern, and the like for testing quality, defection, and the like of a liquid crystal device during manufacturing and at the time of shipping may be formed on the substrate 10 in addition to the scan line driving circuits 102 and the signal line driving circuit 103.

As illustrated in FIG. 2, each pixel 101 includes an organic EL element 2D as a light emitting element, a pixel selection transistor 2A, a driving transistor 2B, and a holding capacitance 2C. A gate of the pixel selection transistor 2A is connected to a corresponding scan line GL101. One of a source and a drain of the pixel selection transistor 2A is connected to a corresponding signal line DL101 and the other thereof is connected to a gate "g" of the driving transistor 2B. One of a source "s" and a drain "d" of the driving transistor 2B is connected to the organic EL element 2D and the other thereof is connected to a corresponding power line PL101. In the embodiment, the drain "d" of the driving transistor 2B is connected to the power line PL101 and the source "s" thereof is connected to an anode of the organic EL element 2D. A cathode of the organic EL element 2D is connected to a power supply wiring 2G. It is to be noted that the power supply wiring 2G is commonly wired to all the pixels 101. The holding capacitance 2C is provided between the source "s" and the gate "g" and connected thereto of the driving transistor 2B.

On each pixel 101, if the scan line GL101 is driven and the pixel selection transistor 2A is made ON state, an image signal supplied through the signal line DL101 is held by the holding capacitance 2C and ON/OFF state of the driving transistor 2B is determined in accordance with a state of the holding capacitance 2C. Further, if the organic EL element 2D is electrically connected to the power line P101 through the driving transistor 2B, a driving current is flowed from the power line PL101 to the organic EL element 2D. The organic EL element 2D emits light with brightness in accordance with an amount of current flowing between the anode (positive electrode as a first electrode) and the cathode (negative electrode as a second electrode) of the organic EL element 2D.

As illustrated in FIG. 3, each pixel 101 has a substantially rectangular planar shape of which four corners are roundly formed, for example. A direction along short sides of each pixel 101 corresponds to the extending direction of the scan lines GL101 (see, FIG. 2). Further, a direction along long sides of each pixel 101 corresponds to the extending direction of the signal lines DL101 (see, FIG. 2). A positive electrode 3A as the first electrode of the organic EL element 2D is arranged for each pixel 101. Further, the pixel 101 has an insulating layer 3F having an opening 3D which planarly overlaps with the positive electrode 3A. A region of the pixel 101 corresponds to a region on which emitted light is obtained by the organic EL element 2D and is defined by an outer shape of the opening 3D. Each pixel 101 has a display portion 3B and a contact portion 3C.

A reflecting layer 3E is arranged for each pixel 101. In FIG. 3, the insulating layer 3F is shaded for making a configuration be easily understood. A region of the insulating layer 3F, which overlaps with the opening 3D in a planar view, corresponds to the display portion 3B. The display portion 3B is a region which essentially contributes to display an image on a region of each pixel 101. On the display portion 3B, light emitted from the organic EL element 2D is reflected by the reflecting layer 3E and is emitted to the side of a color filter 4L (see, FIG. 4).

A third interlayer insulating film 4H (see, FIG. 4) as an insulating layer is arranged on the reflecting layer 3E. The third interlayer insulating film 4H has an opening 4I for each pixel 101. A region which overlaps with the opening 4I in a planar view corresponds to the contact portion 3C. The contact portion 3C is arranged so as to correspond to an arrangement position of the driving transistor 2B. The positive electrode 3A located at the upper side of the third interlayer insulating film 4H is conductively connected onto the contact portion 3C (opening 4I). The contact portion 3C is located at an end side in the direction along the long sides of each pixel 101, for example. It is to be noted that the arrangement position of the contact portion 3C is not limited to the mode and may be arranged at a center portion of each pixel 101, for example, in accordance with the arrangement position of the driving transistor 2B.

As illustrated in FIG. 4, a base protecting film 4A is formed on a substrate surface of the element substrate 10. The base protecting film 4A is formed by a silicon oxide film, a silicon nitride film, or the like. A thin film transistor 4Ba (pixel selection transistor 2A) and a thin film transistor 4Bb (driving transistor 2B) are formed on a surface side of the base protecting film 4A. The thin film transistor 4Ba and the thin film transistor 4Bb have lightly doped drain (LLD) configurations in which channel formation regions 4Ca, highly doped source/drain regions 4Cb, and lightly doped source/drain regions 4Cc are formed on island-form polycrystalline silicon films 4C. Further, the thin film transistor 4Ba and the thin film transistor 4Bb have gate electrodes 4E arranged on the channel formation regions 4Ca through a gate insulating layer 4D formed by a silicon oxide film.

In the embodiment, each polycrystalline silicon film 4C is a polycrystalline silicon film obtained by forming an amorphous silicon film on the element substrate 10, and then, polycrystallizing the amorphous silicon film by laser annealing, lamp annealing, or the like. The lightly doped source/drain region 4Cc is a semiconductor region which is formed by implanting lightly doped n-type impurity ions (phosphorus ions) in a dose of approximately $0.1 \times 10^{13}/cm^2$ to approximately $10 \times 10^{13}/cm^2$ in a self-aligned manner by using the gate electrode 4E as a mask. The highly doped source/drain region 4Cb is a semiconductor region which is formed by implanting highly doped n-type impurity ions (phosphorus ions) in a dose of approximately $0.1 \times 10^{15}/cm^2$ to approximately $10 \times 10^{15}/cm^2$ by using a resist mask.

A first interlayer insulating film 4Fa and a second interlayer insulating film 4Fb as a passivation film are formed in this order at the upper layer side of the thin film transistor 4Ba and the thin film transistor 4Bb. The first interlayer insulating film 4Fa is formed by a silicon oxide film. The second interlayer insulating film 4Fb is formed by a silicon nitride film. Signal wirings 4G are formed between the first interlayer insulating film 4Fa and the second interlayer insulating film 4Fb. The reflecting layer 3E formed by an Al film is formed on a surface of the second interlayer insulating film 4Fb. The third interlayer insulating film 4H formed by a silicon nitride film is formed on the reflecting layer 3E. The positive electrode 3A as the first electrode, which is formed by an ITO film, is formed on the third interlayer insulating film 4H. The thin film transistor 4Ba corresponds to the pixel selection transistor 2A in the equivalent circuit diagram. The signal line DL101 formed by the signal wiring 4G is connected to the source region of the thin film transistor 4Ba through a contact hole 4Ma. A signal wiring 4Gg formed by the signal wiring 4G is connected to the drain region of the thin film transistor 4Ba through a contact hole 4Mb. The signal wiring 4Gg is connected to a gate electrode 4Eg of the thin film transistor 4Bb through a contact hole 4Md. The thin film transistor 4Bb corresponds to the pixel selection transistor 2B in the equivalent circuit diagram. The power line PL101 formed by the signal wiring 4G is connected to the drain region of the thin film transistor 4Bb through a contact hole 4Mc. In FIG. 4, the contact hole 4Mc and the power line PL101 are indicated by dashed lines for distinguishing them from the signal wiring 4Gg. The source region of the thin film transistor 4Bb is connected to the signal wiring 4Gs through a contact hole 4Me. The signal wiring 4Gs is connected to a signal wiring 3Es formed by the reflecting layer 3E through a contact hole 4Mg. The signal wiring 3Es is connected to the positive electrode 3A through the opening 4I (contact hole 4I). A signal wiring 3Eg formed by the reflecting layer 3E is connected to the signal wiring 4Gg through a contact hole 4Mf.

Further, the signal electrode 3Eg as a lower electrode and the positive electrode 3A as an upper electrode are opposed to each other through the third interlayer insulating film 4H on a part of the pixel 101 so as to constitute the holding capacitance 2C.

The fourth interlayer insulating film 3F formed by a silicon oxide film is formed on the positive electrode 3A. The opening 3D is provided on the fourth interlayer insulating film 3F. An organic functional layer 4J is formed on the fourth interlayer insulating film 3F and the opening 3D. A negative electrode 2G as the second electrode, which is formed by an alloy of Mg and Ag, for example, is formed on the organic functional layer 4J.

Further, the organic EL element 2D in which the positive electrode 3A and the negative electrode 2G are opposed to each other through the organic functional layer 4J is constituted on a region of the opening 3D. An optical resonator 4N which resonates light from the organic functional layer 4J is constituted by the negative electrode 2G and the reflecting layer 3E. A distance between the negative electrode 2G and the reflecting layer 3E is designed in accordance with a wavelength to be resonated. A resonant wavelength on the optical resonator 4N can be adjusted by changing an optical path length L between the reflecting layer 3E and the negative electrode 2G. It is assumed that a peak wavelength of a spectrum of light which is desired to be extracted in light emitted from the organic functional layer 4J is λ. Under the assumption, the following relational expression is satisfied. Note that Φ (radian) indicates phase shift which is generated when light emitted from the organic functional layer 4J is reflected by both ends (for example, reflecting layer 3E and negative electrode 2G) of the optical resonator 4N. For example, in order to extract emitted red light having a wavelength of 610 nm, the third interlayer insulating film 4H is set to be formed by the silicon nitride film having a film thickness of 50 nm and the positive electrode 3A is set to be formed by the ITO film having a film thickness of 100 nm. Further, the organic functional layer 4J is set to have a film thickness of 150 nm and the negative electrode 2G is set to be formed by the alloy of Mg and Ag having a film thickness of 20 nm.

$$(2L)/\lambda + \Phi/(2\pi) = m \text{ ("m" is an integer number)}$$

A sealing insulating film 4Ka formed by a silicon oxide film is formed on the negative electrode 2G. A color resist layer 4L is formed on the sealing insulating film 4Ka. The color resist layer 4L has a function of transmitting light of a specified wavelength. A sealing insulating film 4Kb formed by a silicon oxide film is formed on the color resist layer 4L.

Light emitted from the organic EL element 2D passes through the color resist layer 4L and is output in a panel surface direction after the light having a specified wavelength has been amplified by the optical resonator 4N constituted by the negative electrode 2G and the reflecting layer 3E. That is to say, the organic EL device 100 makes it possible to realize full color display of a top emission type in which light from the organic EL element 2D passes through the color resist layer 4L and is emitted.

As described above, with the organic EL device 100 according to the embodiment, the following effects can be obtained.

The organic EL device 100 includes the negative electrode 2G which is arranged on the organic functional layer 4J and has light reflectivity and light transmissivity, and the optical resonator 4N which is formed between the reflecting layer 3E and the negative electrode 2G and resonates light from the organic functional layer 4J. In addition, the holding capacitance 2C is constituted by using the reflecting layer 3E, the insulating layer 4H, and the positive electrode 3A. Therefore, the holding capacitance 2C, the pixel selection transistor 2A (4Ba), and the driving transistor 2B (4Bb) are not required to be arranged on the same plane resulting in reducing a pixel circuit in size. This makes it possible to form each pixel 101 smaller in size. Accordingly, the organic EL device 100 of a top emission type, which is reduced in size and has high quality, can be provided.

Second Embodiment

Next, an organic EL device according to the second embodiment is described with reference to FIG. 5.

Figure 5:
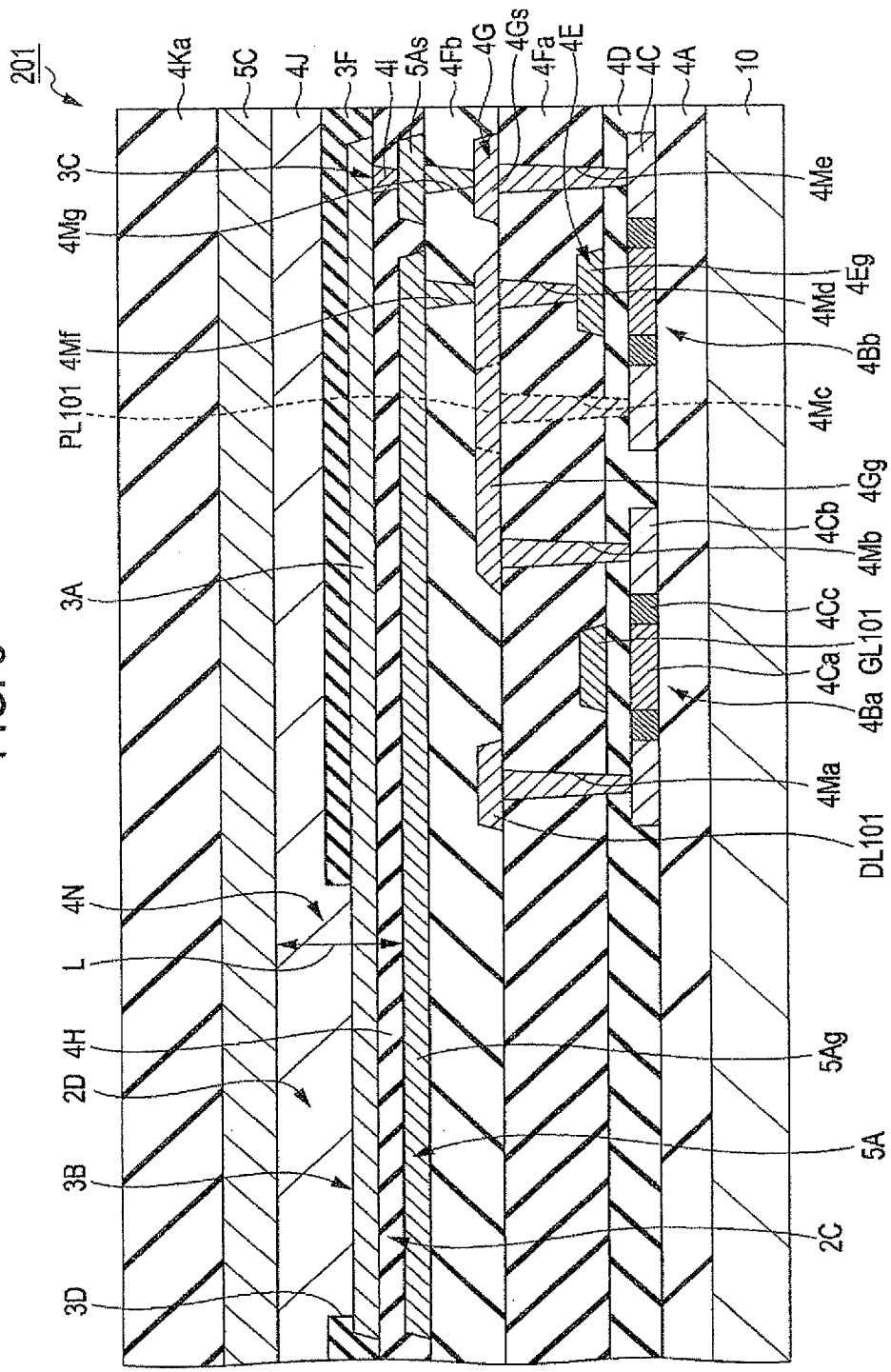
FIG. 5 is a schematic cross-sectional view illustrating a configuration of a pixel on an organic EL device according to a second embodiment.

FIG. 5 is a schematic cross-sectional view illustrating a configuration of a pixel on the organic EL device according to the second embodiment. It is to be noted that the same constituent components as those in the first embodiment are denoted with the same reference numerals and overlapping description is not repeated. In the second embodiment, the invention is applied to an organic EL device of a bottom emission type.

As illustrated in FIG. 5, an organic EL device 200 according to the embodiment has a pixel 201. As for a configuration of the pixel 201, configurations of the second interlayer insulating film 4Fb and thereunder are the same as those of the organic EL device 100 in the above first embodiment. A reflecting semi-transmissive layer 5A formed by an Al film is formed on a surface of the second interlayer insulating film 4Fb. The third interlayer insulating film 4H formed by the silicon nitride film is formed on the reflecting semi-transmissive layer 5A. The positive electrode 3A as the first electrode, which is formed by the ITO film, is formed on the third interlayer insulating film 4H. The thin film transistor 4Ba corresponds to the pixel selection transistor 2A in the equivalent circuit diagram. The signal line DL101 formed by the signal wiring 4G is connected to the source region of the thin film transistor 4Ba through the contact hole 4Ma. The signal wiring 4Gg formed by the signal wiring 4G is connected to the drain region of the thin film transistor 4Ba through the contact hole 4Mb. The signal wiring 4Gg is connected to the gate electrode 4Eg of the thin film transistor 4Bb through the contact hole 4Md. The thin film transistor 4Bb corresponds to the pixel selection transistor 2B in the equivalent circuit diagram. The power line PL101 formed by the signal wiring 4G is connected to the drain region of the thin film transistor 4Bb through the contact hole 4Mc. In FIG. 5, the contact hole 4Mc and the power line PL101 are indicated by dashed lines for distinguishing them from the signal wiring 4Gg. The source region of the thin film transistor 4Bb is connected to the signal wiring 4Gs through the contact hole 4Me. The signal wiring 4Gs is connected to a signal wiring 5As formed by the reflecting semi-transmissive layer 5A through the contact hole 4Mg. The signal wiring 5As is connected to the positive electrode 3A through the opening 4I (contact hole 4I). A reflecting semi-transmissive layer 5Ag is connected to the signal wiring 4Gg through the contact hole 4Mf.

Further, the reflecting semi-transmissive layer 5Ag as a lower electrode and the positive electrode 3A as an upper electrode are opposed to each other through the third interlayer insulating film 4H on a part of the pixel 201 so as to form the holding capacitance 2C.

The fourth interlayer insulating film 3F formed by the silicon oxide film is formed on the positive electrode 3A. The opening 3D is provided on the fourth interlayer insulating film 3F. The organic functional layer 4J is formed on the fourth interlayer insulating film 3F and the opening 3D. The negative electrode 2G as the second electrode, which is formed by an alloy of Mg and Ag, or Al, for example, is formed on the organic functional layer 4J. The negative electrode 2G also serves as a reflecting layer. The sealing insulating film 4Ka formed by the silicon oxide film is formed on the negative electrode 2G.

Further, the organic EL element 2D in which the positive electrode 3A and the negative electrode 2G are opposed to each other through the organic functional layer 4J is constituted on a region of the opening 3D. The optical resonator 4N which resonates light from the organic functional layer 4J is constituted by the negative electrode 2G and the reflecting semi-transmissive layer 5A. A distance between the negative electrode 2G and the reflecting semi-transmissive layer 5A is designed in accordance with light of a wavelength to be resonated. For example, in order to extract emitted red light having a wavelength of 610 nm, the reflecting semi-transmissive layer 5A is set to be formed by the Al film having a film thickness of 20 nm, the third interlayer insulating film 4H is set to be formed by the silicon nitride film having a film thickness of 50 nm, and the positive electrode 3A is set to be formed by the ITO film having a film thickness of 100 nm. Further, the organic functional layer 4J is set to have a film thickness of 150 nm and the negative electrode 2G is set to be formed by the Al film having a film thickness of 20 nm.

Light emitted from the organic EL element 2D passes through the element substrate 10 and is emitted in a panel rear surface direction after the light having a specified wavelength has been amplified by the optical resonator 4N formed by the negative electrode 2G and the reflecting semi-transmissive layer 5A.

As described above, with the organic EL device 200 according to the embodiment, the following effects can be obtained.

The holding capacitance 2C forming a pixel circuit can be laminated with the opening 3D by forming the holding capacitance 2C using the reflecting semi-transmissive layer 5A, the insulating layer 4H, and the positive electrode 3A. This makes it possible to form each pixel 201 smaller in size. Accordingly, the organic EL device 200 of a bottom emission type, which is reduced in size and has high quality, can be provided.

Third Embodiment

Figure 6A:
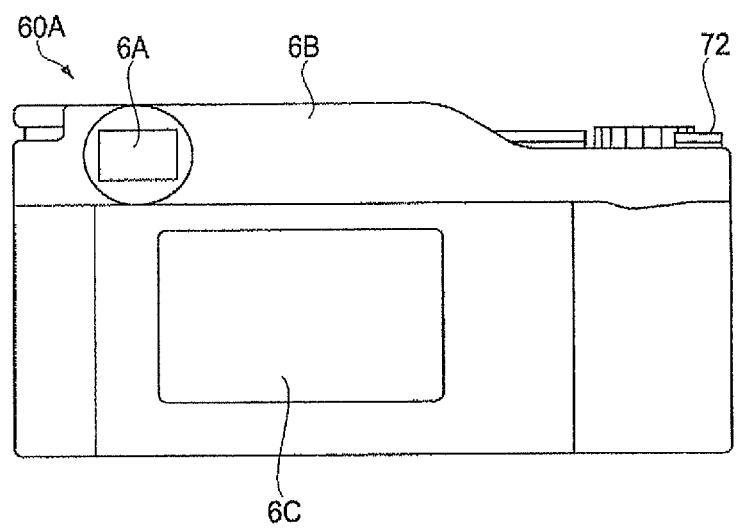
FIG. 6A is a plan view schematically illustrating an EVF as an electronic apparatus.
Figure 6B:
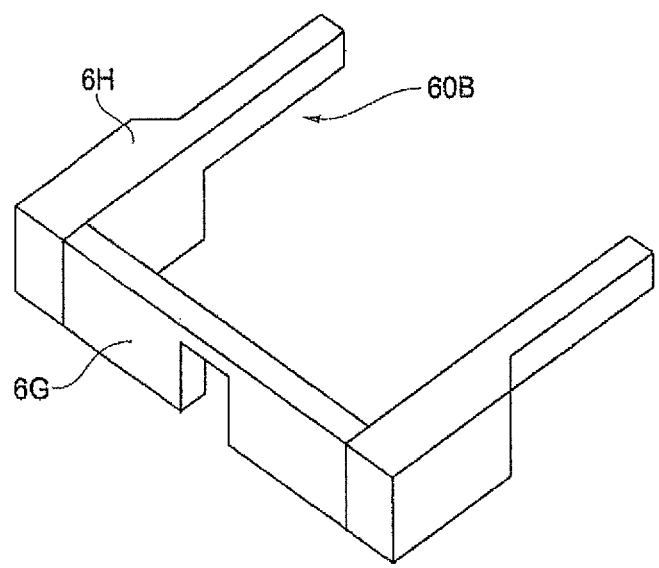
FIG. 6B is a plan view schematically illustrating an HMD as an electronic apparatus.
Figure 7:
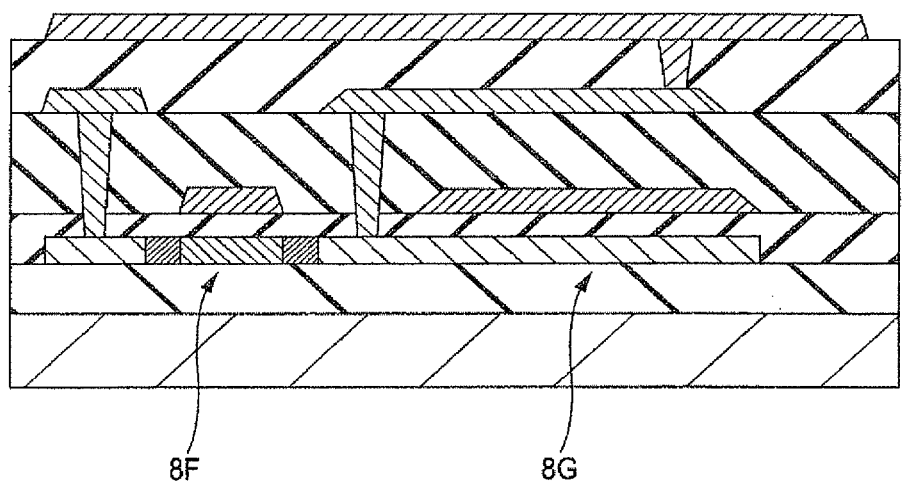
FIG. 7 is a schematic cross-sectional view illustrating a configuration of a pixel on an existing organic EL device.

Next, electronic apparatuses according to the embodiment are described with reference to FIGS. 6A and 6B. FIG. 6A is a view illustrating a digital camera as an electronic apparatus. FIG. 6B is a view illustrating a head mounted display (HMD) as an electronic apparatus.

As illustrated in FIG. 6A, a digital camera 60A as an electronic apparatus according to the embodiment includes a main unit 6B having an optical system such as an image capturing element. An electronic view finder (EVF) 6A for visually recognizing a target and a monitor 6C for displaying a captured image are provided on the main unit 6B. The organic EL device 100 (or the organic EL device 200) according to the above embodiment is mounted on each of the electronic finder 6A and the monitor 6C.

As illustrated in FIG. 6B, a head mounted display 60B as another electronic apparatus according to the embodiment includes a pair of supporting portions 6H for attaching the head mounted display 60B on a head of a viewer and a display portion 6G which is provided between the pair of supporting portions 6H and displays an image for right and left eyes of the viewer.

The organic EL device 100 (or the organic EL device 200) according to the above embodiment is mounted on the display portion 6G.

The organic EL device 100 (or the organic EL device 200) according to the above embodiment is reduced in size and can display an image with high quality. Therefore, the digital camera 60A reduced in size and the head mounted display 60B which is light-weight can be realized by using the organic EL device 100 (or the organic EL device 200).

Electronic apparatuses to which the organic EL device 100 or 200 is applied are not limited to the digital camera 60A and the head mounted display 60B. For example, the electronic apparatus to which the organic EL device 100 or 200 is applied can be used as a display portion of an information terminal apparatus such as a mobile phone, a PDA, and a GPS.

What is claimed is:

1. An organic EL device comprising:
    a base substrate;
    a reflecting semi-transmissive layer which is arranged on the base substrate and has light reflectivity and light transmissivity;
    a first electrode which is arranged on the reflecting semi-transmissive layer through an insulating layer for each pixel and has light transmissivity;
    an organic functional layer which is arranged on the first electrode and includes at least a light emitting layer;
    a second electrode which is arranged on the organic functional layer and has light reflectivity; and
    a holding capacitance,
    an optical resonator which resonates light from the organic functional layer being formed by the reflecting semi-transmissive layer and the second electrode, and
    the holding capacitance being formed using the reflecting semi-transmissive layer, the insulating layer, and the first electrode.

2. The organic EL device according to claim 1, further including a first transistor connected to the first electrode,
    the holding capacitance being provided between a source of the first transistor and a gate of the first transistor and connected thereto.

3. The organic EL device according to claim 1,
    the reflecting layer being arranged for each pixel.

4. The organic EL device according to claim 2,
    the reflecting layer being electrically connected to the gate of the first transistor.

5. The organic EL device according to claim 2, further comprising a first signal wiring which is provided on a layer which is different from a gate electrode of the first transistor through a second insulating layer, and is different from the reflecting layer through a third insulating layer,
    the gate electrode being connected to the first signal wiring through a first contact hole which is provided on the second insulating layer, and
    the reflecting layer being connected to the first signal wiring through a second contact hole which is provided on the third insulating layer.

6. The organic EL device according to claim 2, further including a second transistor which is provided between a second signal wiring and a gate of the first transistor and connected thereto.

7. The organic EL device according to claim 6,
    a drain of the second transistor being connected to the second signal wiring through a third contact hole which is provided on the second insulating layer.

8. The organic EL device according to claim 1,
    each pixel adjacent to each other being configured to emit light of a color different from that of an adjacent pixel's light.

9. An electronic apparatus comprising the organic EL device according to claim 1.

10. An electronic apparatus comprising the organic EL device according to claim 2.

11. An electronic apparatus comprising the organic EL device according to claim 3.

12. An electronic apparatus comprising the organic EL device according to claim 4.

13. An electronic apparatus comprising the organic EL device according to claim 5.

14. An electronic apparatus comprising the organic EL device according to claim 6.

15. An electronic apparatus comprising the organic EL device according to claim 7.

16. An electronic apparatus comprising the organic EL device according to claim 8.

* * * * *